United States Patent [19]

Wu et al.

[11] Patent Number: 5,378,942
[45] Date of Patent: Jan. 3, 1995

[54] CMOS DYNAMIC LOGIC STRUCTURE

[75] Inventors: Chung-Yu Wu, Hsinchu; Kuo-Hsing Cheng, Taipei, both of Taiwan, Prov. of China

[73] Assignee: National Science Council, Taipei, Taiwan, Prov. of China

[21] Appl. No.: 71,523

[22] Filed: Jun. 3, 1993

[51] Int. Cl.⁶ ............... H03K 19/096; H03K 19/0948
[52] U.S. Cl. ........................................ 326/97; 326/21
[58] Field of Search ............... 307/451, 452, 453, 481, 307/443

[56] References Cited

U.S. PATENT DOCUMENTS

| | | | |
|---|---|---|---|
| 4,565,934 | 1/1986 | Southerland, Jr. | 307/481 |
| 4,700,088 | 10/1987 | Tubbs | 307/481 |
| 4,820,943 | 4/1989 | Makino et al. | 307/452 |
| 5,291,076 | 3/1994 | Bridges et al. | 307/452 |

FOREIGN PATENT DOCUMENTS

59-154823  9/1984  Japan ..................... 307/452

Primary Examiner—Edward P. Westin
Assistant Examiner—Jon Santamauro
Attorney, Agent, or Firm—Fish & Richardson

[57] ABSTRACT

A CMOS dynamic logic structure has a plurality of logic gates, and the logic gates includes type-1 and type-3 logic gates alternately connected with each other. Each logic gate is separated into a function unit and a driver unit. The function unit has a PMOS precharge transistor, and a logic tree block stacked with the PMOS precharge transistor. The driver unit has an NMOS evaluation transistor, and the NMOS evaluation transistor and the PMOS precharge transistor of the previous-stage logic gate is controlled by an identical clock in order not to be turned on simultaneously.

2 Claims, 10 Drawing Sheets

$t_{dis} = t_2' - t_1'$

$t_{pr} = \text{MAX}(t_{r1}, t_{r2})$

$t_{eva} = t2 - t1$

CMOS DYNAMIC LOGIC STRUCTURE

BACKGROUND OF THE INVENTION

The present invention relates generally to a CMOS (Complementary Metal-Oxide Semiconductor) dynamic logic structure, and more particularly to a high-speed four-phase CMOS dynamic logic structure which has an operation speed higher than the prior art, and can avoid the charge redistribution and clock-skew race problems.

Recently, CMOS dynamic logics have been widely applied to the high-performance VLSI (Very Large-Scale Integration) products, such as the pipelined multiplier, etc. In the VLSI, the most important subject is how to accelerate the operation speed. The operation speed of the VLSI depends on the operation speed of the processing element, i.e. the basic logic gate. In order to improve the operation speed, many CMOS dynamic logic structures usually suffer from some problems, e.g. the charge redistribution and clock-skew race. Also, there is still a strong desire existed in this art to further improve the operation speed of the CMOS dynamic logic.

Figure 1:
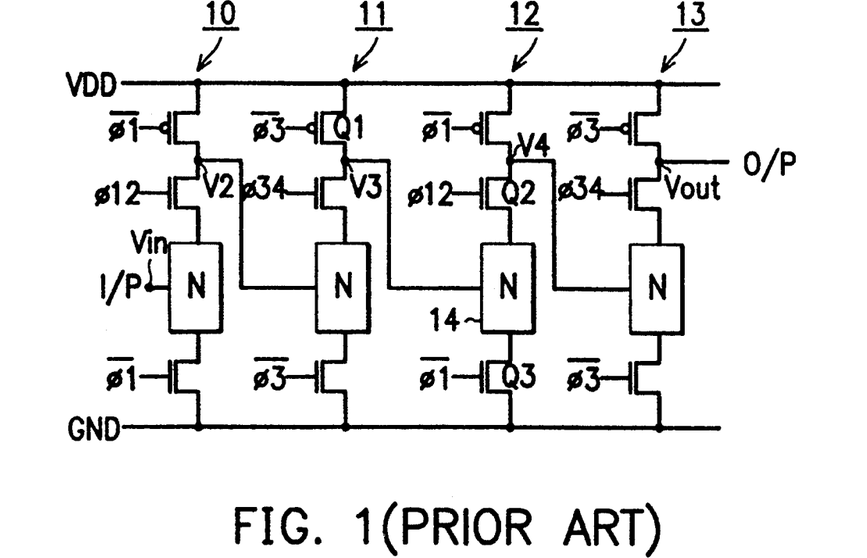
FIG. 1 is a schematically electrical diagram of a conventional four-phase CMOS dynamic logic structure.

Referring to FIG. 1, there is shown a conventional four-phase CMOS dynamic logic structure which includes a plurality of logic gates, for example four logic gates 10, 11, 12, and 13. Each logic gate is considered of a PMOS (P-type Metal-Oxide Semiconductor) transistor, two NMOS (N-type MOS) transistors, and a logic tree block N, all being stacked together. The logic tree blocks N are used to realize the logic function. All of the PMOS and NMOS transistors are respectively controlled by four kinds of clocks $\phi 1$, $\phi 2$, $\phi 3$, and $\phi 34$ as shown in FIG. 1. As clearly shown in FIG. 1, the control clocks of the logic gate 10 is identical to those of the logic gate 12 while the control clocks of the logic gate 11 is identical to those of the logic gate 13. In this art, the logic gates 10 and 12 are generally defined as the type-1 logic gate, and the logic gates 11 and 13 are defined as the type-3 logic gate. In this four-phase CMOS dynamic logic structure, the type-1 and type-3 logic gates are alternately connected in series, and the circuit has three operation phases, i.e. the precharge (or P), evaluate (or E), and hold (or H) phases. The operation phases of the type-1 and type-3 logic gates respectively in the clock intervals T1 to T4 and T1' to T4' of FIG. 2 are listed in Table I, and repeated every four clock intervals.

TABLE I

| | T1 | T2 | T3 | T4 | T1' | T2' | T3' | T4' |
|---|---|---|---|---|---|---|---|---|
| Type-1 | P | E | H | H | P | E | H | H |
| Type-3 | H | H | P | E | H | H | P | E |

Figure 2:
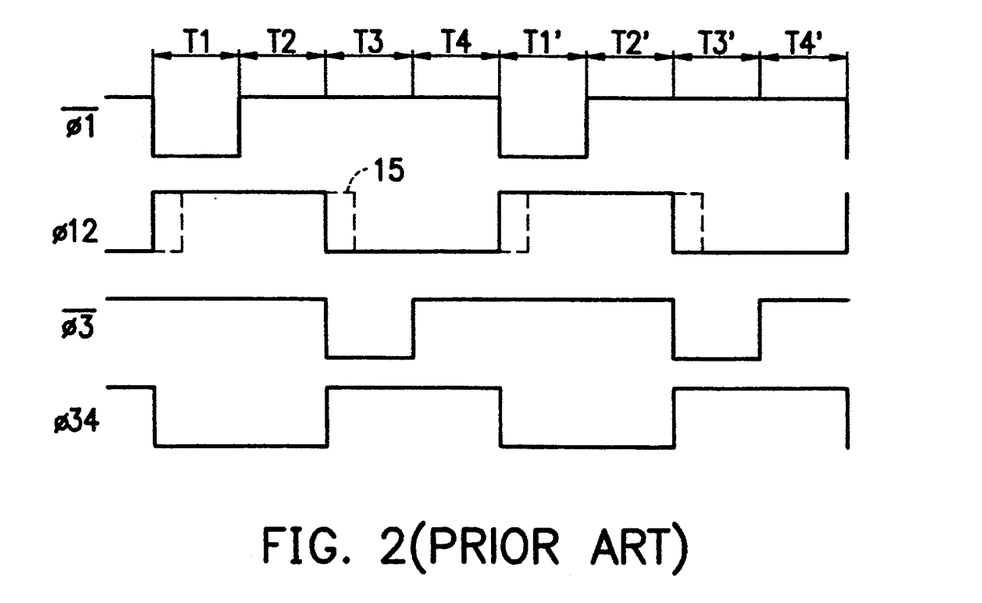
FIG. 2 is a timing diagram of four control clocks for the circuit of FIG. 1.
Figure 3:
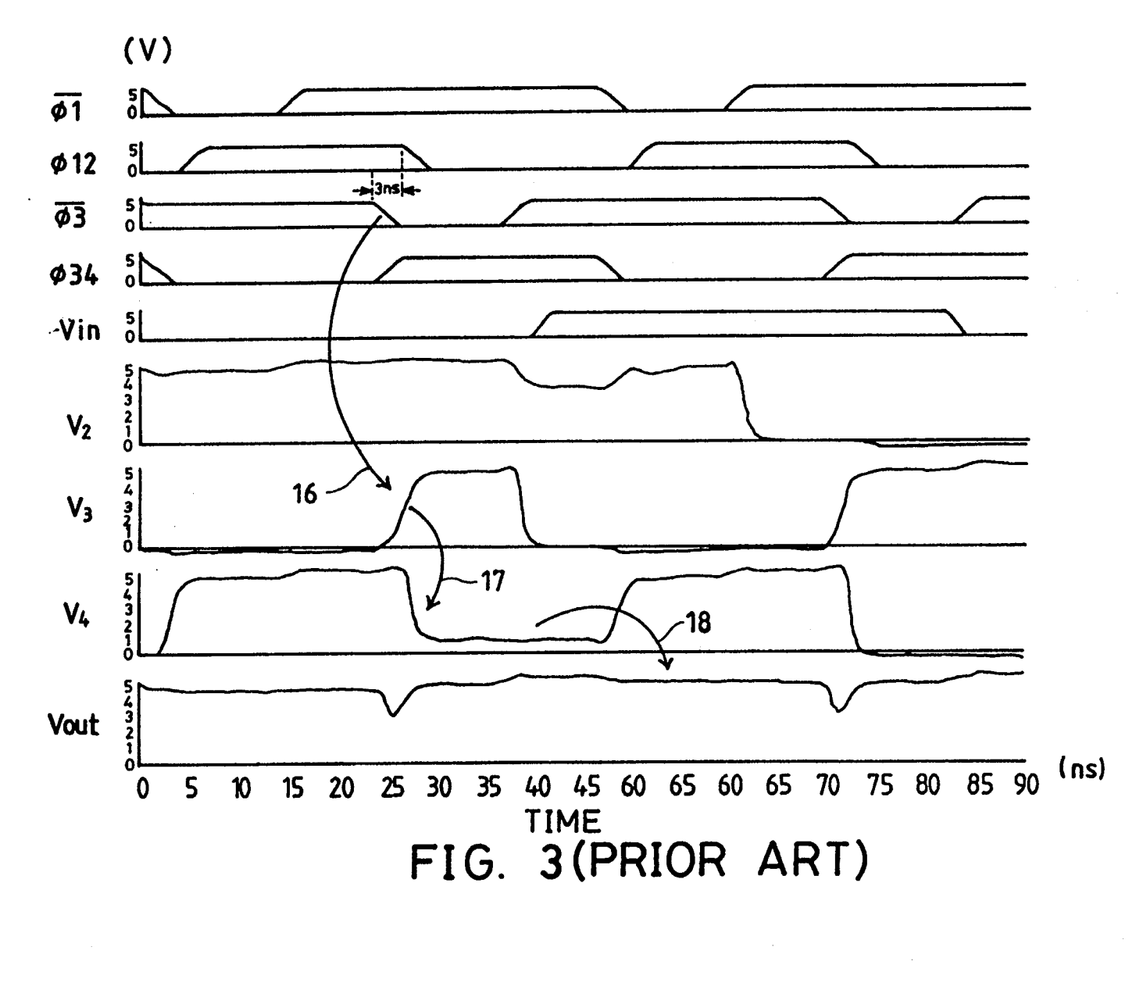
FIG. 3 is transient simulation results of FIG. 1 wherein the circuit is a shift register.

In this conventional CMOS dynamic logic structure, if the clock $\phi 12$ is skew (for example, the dashed lines shown in FIG. 2 illustrate the skew phenomenon of the clock $\phi 12$), a clock-skew race problem happens. Referring to FIGS. 1 to 3, the clock-skew race problem will be described in detail hereinafter. FIG. 3 is the transient simulation results of FIG. 1 wherein the circuit is a shift register, and shows the voltage variations of four control clocks $\phi 1$, $\phi 12$, $\phi 3$, and $\phi 34$, and five nodes $V_{in}$, $V_2$, $V_3$, $V_4$, and $V_{out}$ of FIG. 1. The clock $\phi 12$ of FIG. 3 is skew 3 ns ($10^{-9}$ second), corresponding to the dashed area 15 within the clock interval T3 as shown in FIG. 2. As shown in Table I, the type-1 logic gate is in the hold phase, and the type-3 logic gate is in the precharge phase, during the clock interval T3. At this time, the clock $\phi 3$ turns to a low voltage level (or "0"), and the PMOS transistor Q1 of the type-3 logic gate 11 is turned on the precharge the node $V_3$, as shown by an arrow 16 in FIG. 3. In normal situation, the NMOS transistor Q2 of the type-1 logic gate 12 is turned off to keep the voltage of the node $V_4$ at the previous state. Unfortunately, the clock $\phi 12$ is skew, and thus the transistor Q2 is still "ON". At this time, if the high voltage of the node $V_3$ turns on the logic tree block 14, the node $V_4$ discharges improperly (as shown by an arrow 17 in FIG. 3) because the transistors Q2 and Q3 are all "ON". Consequently, the output is wrong, as shown by an arrow 18 in FIG. 3, and this is the so-called clock-skew race problem.

Figure 4:
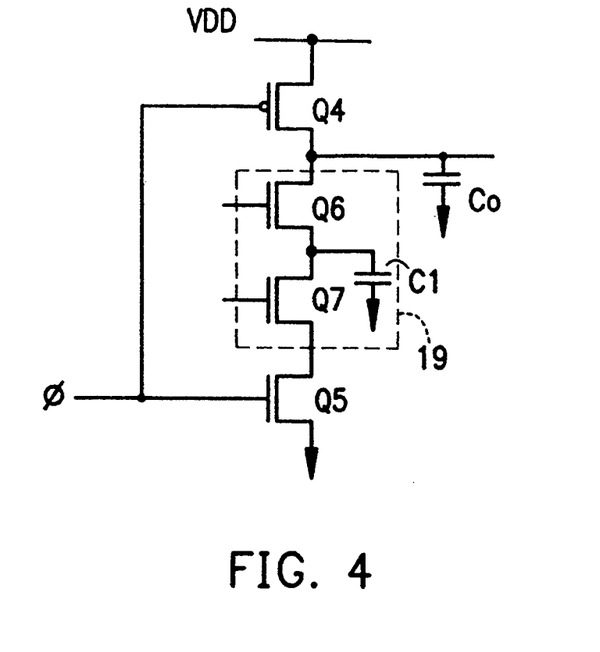
FIG. 4 is a schematically electrical diagram of a conventional logic gate.

Referring to FIG. 4, there is shown a conventional logic gate wherein a capacitor $C_1$ represents the parasitic capacitance of a logic tree block 19. When a clock $\phi$ is "0", a transistor Q4 is turned on to charge an output capacitive load $C_0$ till a high voltage level. At this time, if the inputs of transistors Q6 and Q7 as well as the capacitor $C_1$ are all in a low voltage state, the transistors Q6 and Q7 are turned off, and the voltage of the capacitor $C_1$ is kept at the low voltage state. When the clock $\phi$ turns to high (or "1"), the voltage of the capacitor $C_0$ should be kept at the previous state, i.e. the high voltage state. However, if the input state is changed at this time, resulting in that the transistor Q6 in the logic tree block 19 is turned on, the charge of the capacitor $C_0$ will be redistributed between the capacitors $C_0$ and $C_1$. Consequently, the capacitor $C_0$ has a voltage drop, and this is the so-called charge redistribution problem.

SUMMARY OF THE INVENTION

The primary object of the present invention is to provide a four-phase CMOS dynamic logic structure which can avoid the above-described charge redistribution and clock-skew race problems.

Another object of the present invention is to provide a high-speed four-phase CMOS dynamic logic structure the operation speed of which is at least about 2.5 times higher than the conventional four-phase CMOS dynamic logic structure.

In accordance with the present invention, a CMOS dynamic logic structure comprises:
  a plurality of logic gates, the logic gates being consisted of first and second types of logic gates alternately connected with each other, each logic gate including:
    a function unit having a first-type precharge transistor, and a logic tree block stacked with the first-type precharge transistor; and
    a driver unit coupled to the function unit, and having
      a second-type evaluation transistor, the second-type evaluation transistor and the first-type precharge transistor of the previous-stage logic gate being adapted to be controlled by a first identical clock in order not to be turned on simultaneously.

In accordance with one feature of the present invention, the first-type precharge transistor is a PMOS transistor, and the second-type evaluation transistor is an NMOS transistor.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 5:
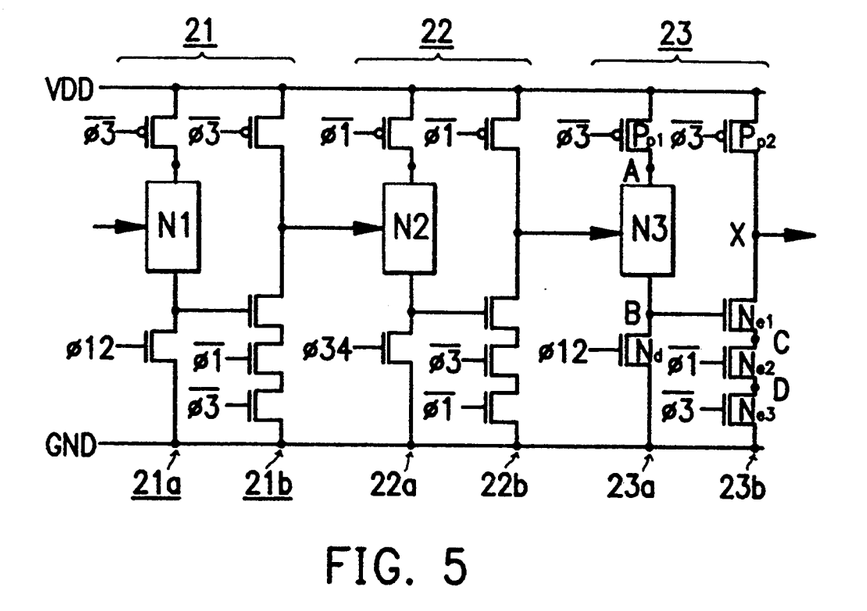
FIG. 5 is a schematically electrical diagram of a four-phase CMOS dynamic logic structure according to one preferred embodiment of the present invention.
Figure 6:
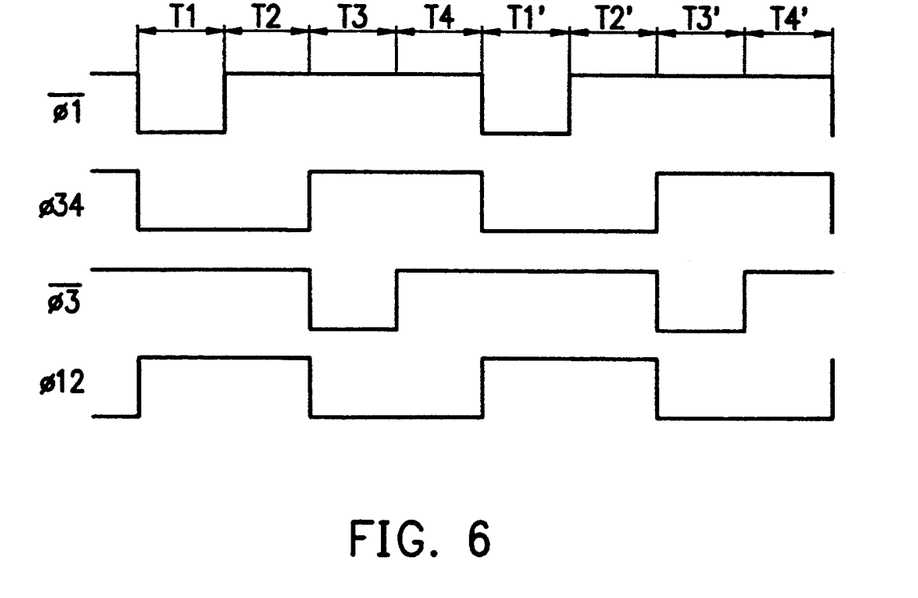
FIG. 6 is a timing diagram of four control clocks for the circuit of FIG. 5.

The present invention proposes a new four-phase CMOS dynamic logic structure which is named a high-speed precharge-discharge CMOS logic (HS-PDCMOS logic) structure in this specification. Referring to FIG. 5, there is shown a first version of HS-PDCMOS logic structure according to one preferred embodiment of the present invention, which comprises a plurality of logic gates, for example three logic gates, 21, 22, and 23. Each logic gate 21, 22, or 23 includes a function unit 21a, 22a, or 23a, and a driver unit 21b, 22b, or 23b. Each function unit is consisted of a PMOS transistor, a logic tree block $N_i$ (i=1, 2, 3), and an NMOS transistor, all being stacked together. Each driver unit is consisted of a PMOS transistor, and three NMOS transistors, all being stacked together. Four control clocks for the HS-PDCMOS logic structure is shown in FIG. 6, and are identical to those shown in FIG. 2. As shown in FIG. 5, the control clocks of the logic gate 21 are identical to those of the logic gate 23, and the logic gates 21 and 23 are defined as the type-3 logic gate. The logic gate 22 is defined as the type-1 logic gate. The type-1 and type-3 logic gates are alternately connected in series. The circuit of the present invention has three operation phases, named the charge/evaluate (C/E), evaluation (E), and discharge/hold (D/H) phases. The operation phases of the type-1 and type-3 logic gates respectively in the clock intervals T1 to T4 and T1' to T4' of FIG. 6 are listed in Table II, and repeated every four clock intervals.

TABLE II

| | T1 | T2 | T3 | T4 | T1' | T2' | T3' | T4' |
|---|---|---|---|---|---|---|---|---|
| Type-1 | C/E | E | D/H | D/H | C/E | E | D/H | D/H |
| Type-3 | D/H | D/H | C/E | E | D/H | D/H | C/E | E |

As shown in FIG. 5, each logic gate is separated into two units, i.e. the function and driver units, and both of the function and driver units all have their own precharge PMOS transistors, for example $P_{p1}$ and $P_{p2}$ of the logic gate 23, which are controlled by an identical control clock $\phi 1$ or $\phi 3$. Thus, the output capacitive load of the HS-PDCMOS logic structure is completely separated from the logic tree block $N_i$ in order to avoid the charge redistribution problem described above with reference to FIG. 4. Furthermore, the output node, for example X, of the driver unit can discharge only through three stacked NMOS transistors, for example the transistors $N_{e1}$, $N_{e2}$, and $N_{e3}$ of the drive unit 23b, and thus its discharge time is very shorter than that of the conventional circuit of FIG. 1 in which the discharge path is through two NMOS transistors, and the logic tree block. Moreover, one of the NMOS transistors of the driver unit, for example the transistor $N_{e2}$ of the driver unit 23b, and the precharge PMOS transistors of the previous-stage logic gate (e.g. 22) are controlled by an identical control clock, for example $\phi 1$ or $\phi 3$, and thus these NMOS and PMOS transistors will not be turned on simultaneously due to their different type features. This can avoid the precharge race problem, i.e. the clock-skew race problem.

Referring to FIGS. 5 and 6, as well as Table II, the operations of the HS-PDCMOS logic structure will be described in detail hereinafter. During the clock interval T2, the clocks 100 3, $\phi 12$, and $\phi 1$ are high, and the logic gate 23 is in the discharge/hold phase. In this operation phase, the transistor $P_{p1}$ is turned off, resulting in that the path from VDD to the node A is off, whereas the paths from the nodes B, C, and D to GND are all on. Therefore, the voltages at the nodes B, C, and D are discharged to 0 Volt. Since the NMOS transistor $N_{e1}$ is off now, the output node X is isolated from the other nodes, and can hold the previous data. During the clock interval T3, the clocks $\phi 3$ and $\phi 12$ turn to low, and the logic gate 23 is in the charge/evaluate phase. In this operation phase, all paths to GND in the logic gate 23 are off, and the transistor $P_{p2}$ is turned on, resulting in that the output node X is precharged to VDD. At this time, the logic gate 22 driving the logic gate 23 is in the discharge/hold phase, and keeps in this phase till the end of the clock interval T4. Consequently, a stable signal can be sent to the input of the logic gate 23 during the period from its charge/evaluate phase to the next phase, i.e. the evaluation phase. Therefore, the logic tree block N₃ of the logic gate 23 acts as a switching network, and perform the desired logic function in the charge/evaluate phase. The logic value at the node B can be obtained in the charge/evaluate phase, and the logic function $f_B$ at the node B can be characterized by:

$$f_B = F_{N3}$$

$f_{N3}$ is the logic function perform by the switching block N₃.

During the clock interval T4, the clock $\phi 3$ turns to high, the clock $\phi 12$ stays low, and the clock $\phi 1$ stays high. The logic gate 23 is in the evaluation phase. In the phase, the transistor $P_{p2}$ is turned off, and the transistors $N_{e2}$ and $N_{e3}$ are turned on. The charges at the output node X may be discharged or keep unchanged, depending on the logic value at the node B. At this time, the previous logic gate 22 is still in the discharge/hold phase with a stable output. Thus, the circuit has no charge redistribution problem. The logic function obtained at the output node X is characterized by:

$$f_x = f_B = F_{N3}$$

The function of the node X is an inverting function of the logic tree block N₃. This verifies the correct logic function performed by this logic structure. It should be noted that the evaluation network, i.e. the driver unit, is separated from the network performing the logic function, i.e. the function unit. Thus, the evaluation path always includes only three stacked NMOS transistors $N_{e1}$, $N_{e2}$, and $N_{e3}$, resulting in the enhancement of the operation speed. Moreover, since the logic gate is separated into two units, i.e. the function and driver unit, the output capacitive load of the HS-PDCMOS logic structure is faster than that of this new logic structure is faster than that of the conventional four-phase logic. Furthermore, the NMOS transistor $N_{e2}$ and the previous precharge PMOS transistor are controlled by an identical clock, and will not be turned on simultaneously. There is no the clock-skew race problem even when the clock is skew.

During the time interval T1', the clocks $\phi 1$ and $\phi 34$ turn to low. The output node of the logic gate 22 is precharged to VDD so as to turn on the NMOS transistors in the logic tree block N₃ of the logic gate 23. In the conventional four-phase logic design in FIG. 1, the precharge race problem, i.e. the clock-skew race problem, may happen. In case of the HS-PDCMOS logic of the present invention, when the clock $\phi 1$ turns to low to precharge the output node of the logic gate 22, it also turns off the NMOS transistor $N_{e2}$ of the logic gate 23 to isolated the output node X of the logic gate 23 from the inputs. Thus, the evaluated logic value at the node X is not affected by the precharging in the logic gate 22. That is to say, the present invention can avoid the clock-skew race problem. During this clock interval T1'; the logic gate 23 beings to discharge the internal node charges inside the logic tree block N₃ while holding the data at the output node X. Thus, the logic gate 23 is in the discharge/hold phase.

As described above, the type-1 and type-3 logic gates are connected alternately to form an extensively pipelined system structure. Static gates may be mixed with the HS-PDCMOS logic structure, if desired, to implement another logic function, and this will not cause the clock-stew problem too. In such a case, the basic operations described above are not altered, but the discharge time may become longer due to the static gate delay.

As known by those skilled in the art, when applying the dynamic logic to the pipelined structure, the maximum system operation frequency of the pipelined structure is limited by some worst-delay gates in the system. If the speed of those gates are accelerated, the entire system speed performance can be improved. Therefore, the logic gate with very high speed and low DC (Direct Current) dissipation according to the present invention can be used in the worst-delay gates to increase the entire operation frequency of the pipelined system.

Figure 7:
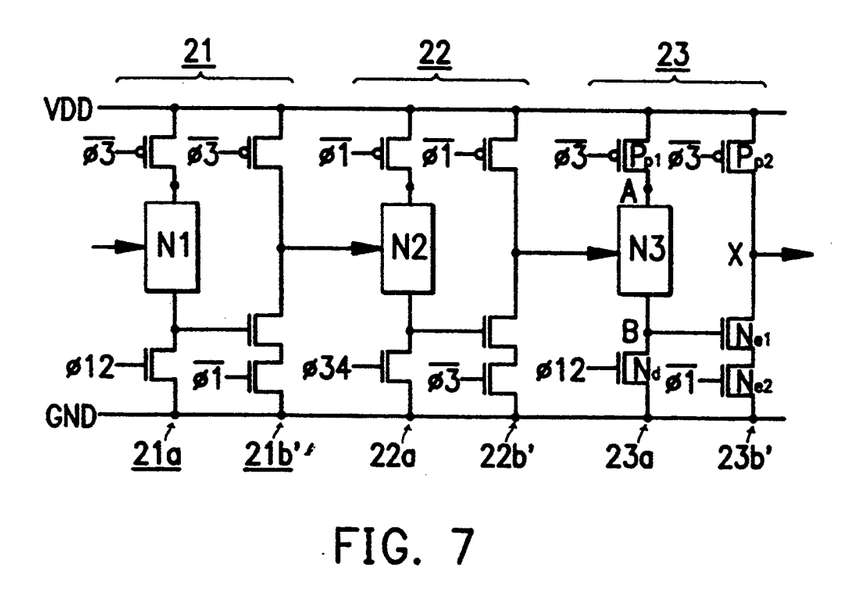
FIG. 7 is a schematically electrical diagram of a four-phase CMOS dynamic logic structure according to another preferred embodiment of the present invention.

Referring now to FIG. 7, there is shown a second version of HS-PDCMOS logic structure according to another preferred embodiment of the present invention. This logic structure is similar to the logic structure shown in FIG. 6, and the sole difference is that the evaluation NMOS transistors $N_{e3}$ in all driver units 21b', 22b', and 23b' of FIG. 7 are omitted. The circuit of FIG. 7 also uses the control clocks shown in FIG. 6, and its operation phases are the same to those listed in Table II. This embodiment has the same logic function and operation manner as the previous embodiment while this embodiment has a faster operation speed but a little DC power dissipation. These differences will be described hereinafter.

During the time interval T3, the logic gate 23 is in the charge/evaluate phase. At this time, if the logic value at the node B is "0", there is no DC power dissipation. The output node X can be precharged to VDD, and keep the voltage level at VDD correctly. If the logic value at the node B is "1", there is a little dc power dissipation. However, this dc power dissipation is very small, and will not affect the entire circuit operation. The reasons are as follows. The voltage at the node B is 0 V at the beginning of the charge/evaluate phase because the transistor $N_d$ is turned on during the time interval T2, and is charged to a voltage level below 2 V at the end of the charge/evaluate phase (this will be further described later). Thus, the NMOS transistor $N_{e1}$ is only slightly turned on during the entire time interval T3, so that the dc power dissipation of the output driver unit 23b' is very small.

Due to this weakly turned-on transistor $N_{e1}$, the voltage at the node X can only be precharged to about 2/3 VDD within a short period of time.

The operation speed is improved because the omission of the evaluation NMOS transistor $N_{e3}$ results in a smaller evaluation path resistance in the output driver unit. If the final output logic value at the node X is "0", the output node X is only precharged to about 2/3 VDD in the charge/evaluate phase. In the next phase, i.e. the evaluation phase, the output voltage at the node X is discharged from 2/3 VDD to 0 V. Due to this smaller voltage swing and evaluation path resistance in logic "0", the evaluation time can be reduced in the evaluation phase.

Figure 8A:
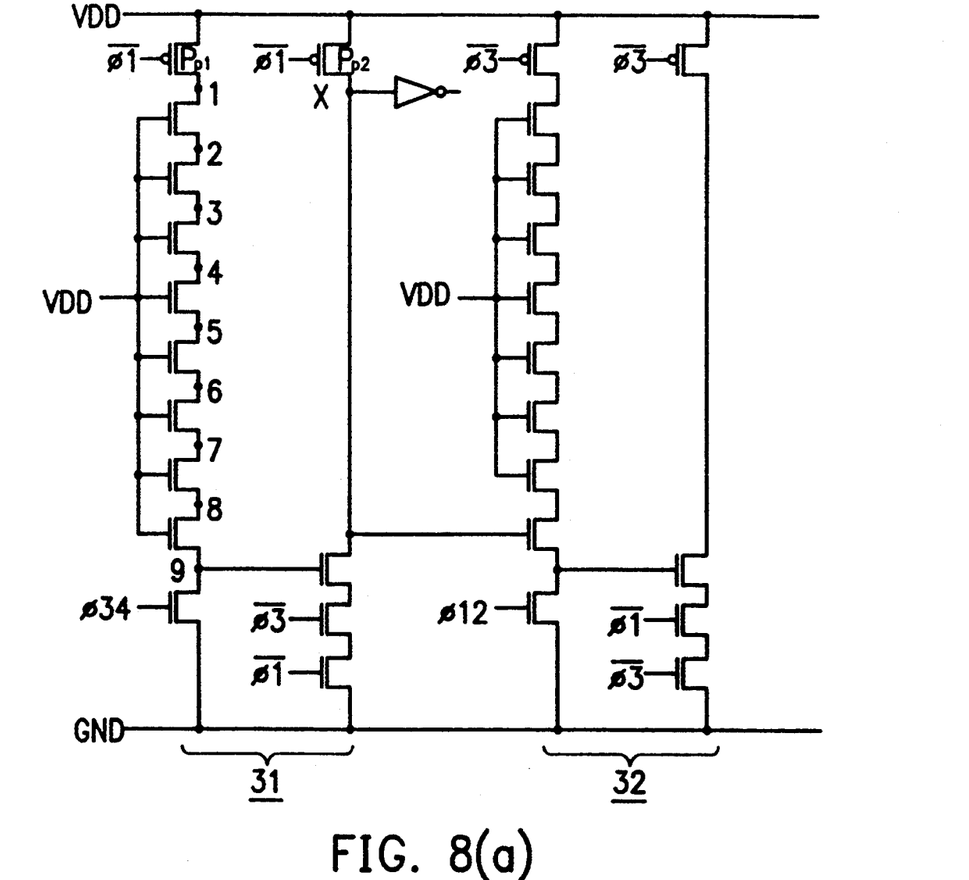
FIG. 8(a) is a schematically electrical diagram of a high-speed precharge-discharge CMOS logic (HS-PDCMOS logic) according to the structure of FIG. 5, which is used to determined the worst charge/evaluate (C/E) time $t_{ce}$.
Figure 8B:
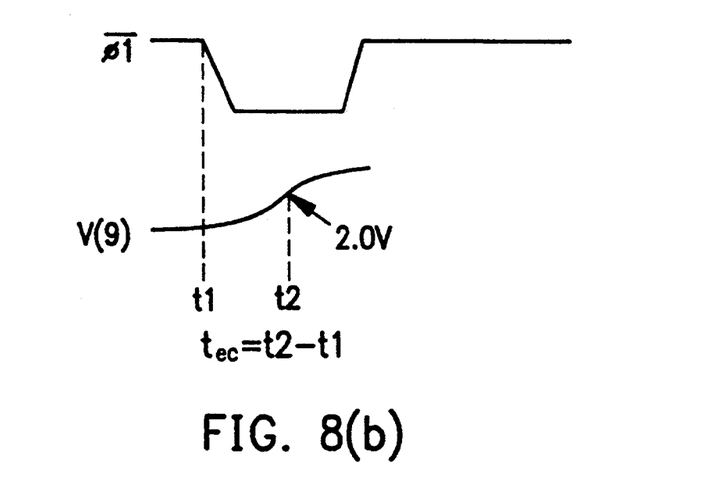
FIG. 8(b) is a schematical voltage variation diagram for a control clock and a node in the circuit of FIG. 8(a)

The speed performance evaluation of the present invention will be further described hereinafter. As shown in FIG. 5, the longest charge/evaluate time is determined by the voltage level at the node B which should be charged. Since the evaluation path includes only three stacked NMOS transistors, $N_{e1}$, $N_{e2}$, and $N_{e3}$, the evaluation speed for the logic "0" can still be very fast even when the node B is only charged to 2.0 V or less at the end of the charge/evaluate phase. The circuit used for the simulation of the worst charge/evaluate time is shown in FIG. 8(a), and is an 8-input HS- PDCMOS NAND gate according the embodiment of FIG. 5. The worst change/evaluate time of the logic gate 31 happens if the charges stored at the output node X and the internal nodes 1-9 have been discharged completely in the previous discharge phase, and the output node will be evaluated low in this phase. As shown in FIG. 8(b), the charge/evaluate time $t_{ce}$ is defined as the time period from the time $t_1$ when the logic gate begins to be charged, to the time $t_2$ when the node 9 is charged to 2.0 V. If the charge voltage at the node 9 is higher than 2.0 V, the evaluation speed of the output node X will be faster in the evaluation phase. However, it requires a longer charge/evaluate time $t_{ce}$ in the charge/evaluate phase. Thus, there exists a compromise between the speeds in the charge/evaluate and evaluation phases. In this case, the voltage 2.0 V is chosen as a reasonable charge/evaluate voltage at the node 9.

As shown in FIG. 7, the evaluation path of this HS-PDCMOS logic structure includes only two NMOS transistors $N_{e1}$ and $N_{e2}$. If the charge voltage is 2 V at the gate of the NMOS transistor $N_{e1}$, the evaluation speed for the logic "0" can be faster than the embodiment of FIG. 5. Keeping the same evaluation speed as in the first version of FIG. 5, the charge voltage at the node B in this version can be lower than 2 V. Thus, the charge/evaluate phase can be made shorter to enhance the operation speed.

Figure 9A:
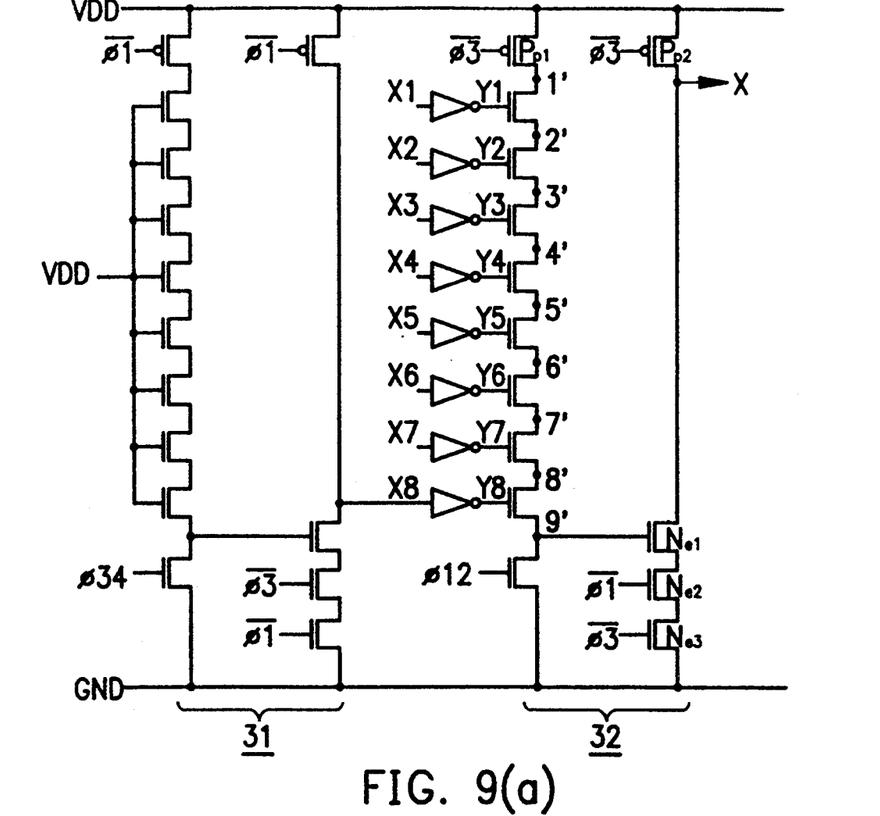
FIG. 9(a) is a schematically electrical diagram of another HS-PDCMOS logic according to the structure of FIG. 5, which is used to determine the worst discharge time $t_{dis}$.
Figure 9B:
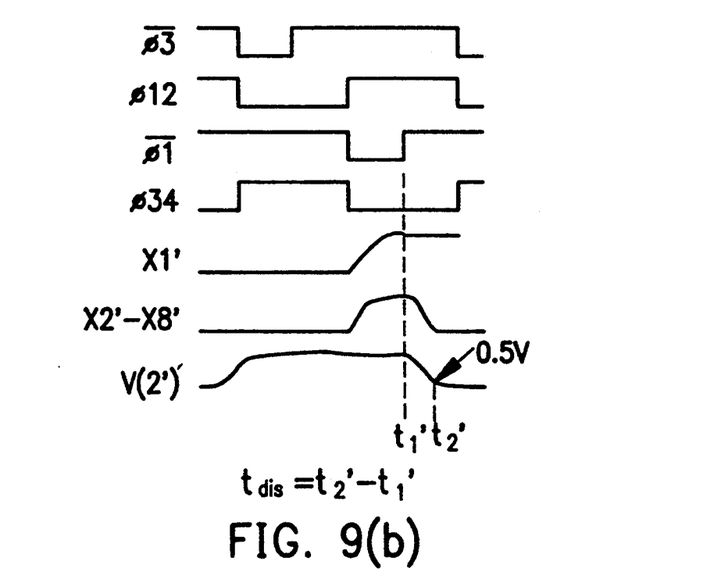
FIG. 9(b) is a schematical voltage variation diagram for several control clocks and nodes in the circuit of FIG. 9(a)

After determining the charge/evaluate time, the worst discharge time and evaluation time are determined to find the overall speed performance. Referring to FIG. 9(a) is considering the worst discharge time, all input signals of the logic gate 32 comes from the preceding (type-1) logic gate 31 via static inverter gates. When the logic gate 32 enters the discharge/hold phase, the logic gate 31 enters the discharge/hold phase, and the voltage at the node $X_8$ is pulled high. This pulls down the voltage at the node $Y_8$ which retards the logic gate 32 to discharge its internal node charge. Thus, the discharge of the logic gate 32 can not be completed in the charge/evaluate phase of the logic gate 31. In the next time interval, the logic gate 32 is still in the discharge/hold phase while the logic gate 32 enters the evaluation phase. It is evident that the discharge of the logic gate 32 can only be completed after the preceding logic gate 31 complete its evaluation operation, and the outputs, i.e. the inputs $X_1$–$X_5$ of the logic gate 32, are stabilized. Since the input signals $X_2$–$X_8$ are stabilized at the logic "0" while the input signal $X_1$ at the logic "1", the worst discharge time of the logic gate 32 is that the residual charges stored at the internal nodes 2' to 8' should be removed. Thus, the required worst discharge time $t_{dis}$ of the logic gate 32 is related to the time of the logic gate 31 being in the evaluation phase. This worst discharge time $t_{dis}$ of the logic gate 32 is longer than the required evaluation time of the logic gate 31 by an amount of static inverter delay plus the time for removing the stored charges at the nodes 2' to 8' in the logic gate 32. Since the worst discharge time is always longer than the evaluation time, only the worst discharge time needs to be considered. As shown in FIG. 9(b), the worst discharge time $t_{dis}$ of the logic gate 32 is defined as the time period from the time $t_1'$ when the preceding logic gate 31 begins to evaluate, to the time $t_2'$ when the voltage at the node 2' is pulled down to 0.5 V. At the time $t_2'$, the voltage of the node 9' is as low as 0.05 V which is small enough to turn off the NMOS transistor $N_{e1}$. It should be noted that if a longer discharge time is given, the voltages at the nodes 2' and 9' can be lower. However, the resulting improvement in the circuit performance is very small, and the speed performance is degraded. Thus, the above reasonable node voltages are chosen for the high speed applications.

After determining the worst charge/evaluate time $t_{ce}$ and the worst discharge time $t_{dis}$, the maximum operation frequency $f_{max}$ of the HS-PDCMOS logic structure is defined as:

$$f_{max} = \frac{1}{2(t_{ce} + t_{dis})}$$

Figure 10A:
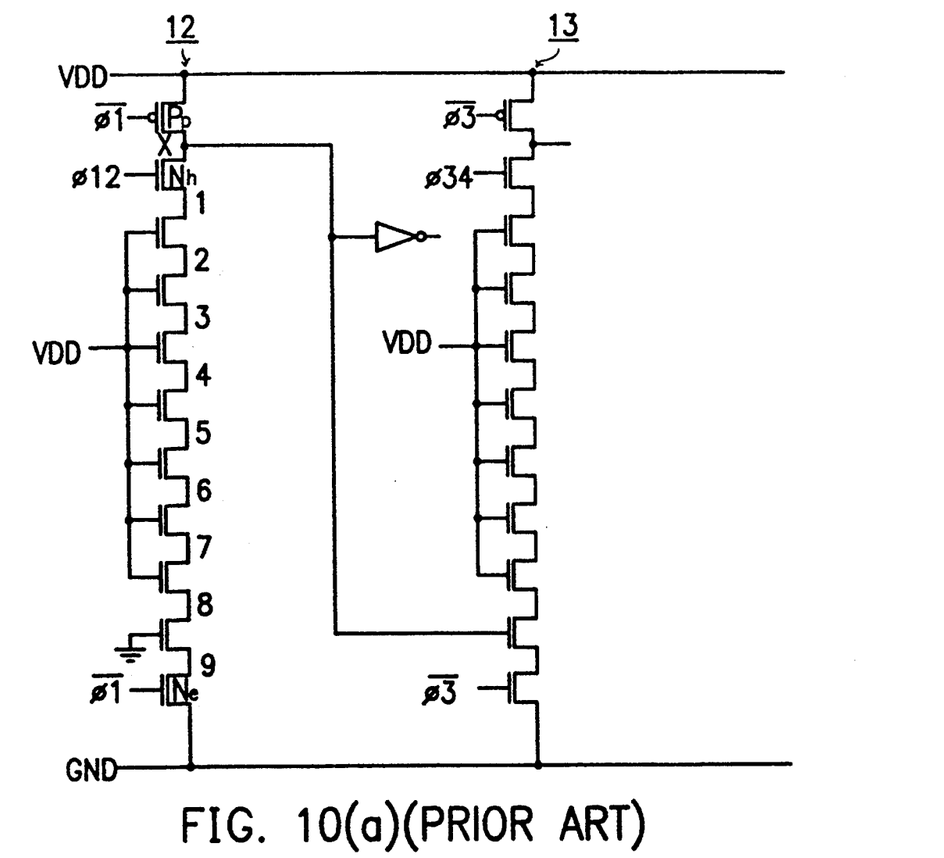
FIG. 10(a) is a schematically electrical diagram of a four-phase CMOS dynamic logic according to the conventional structure of FIG. 1, which is used to determine the worst precharge time $t_{pr}$.
Figure 11A:
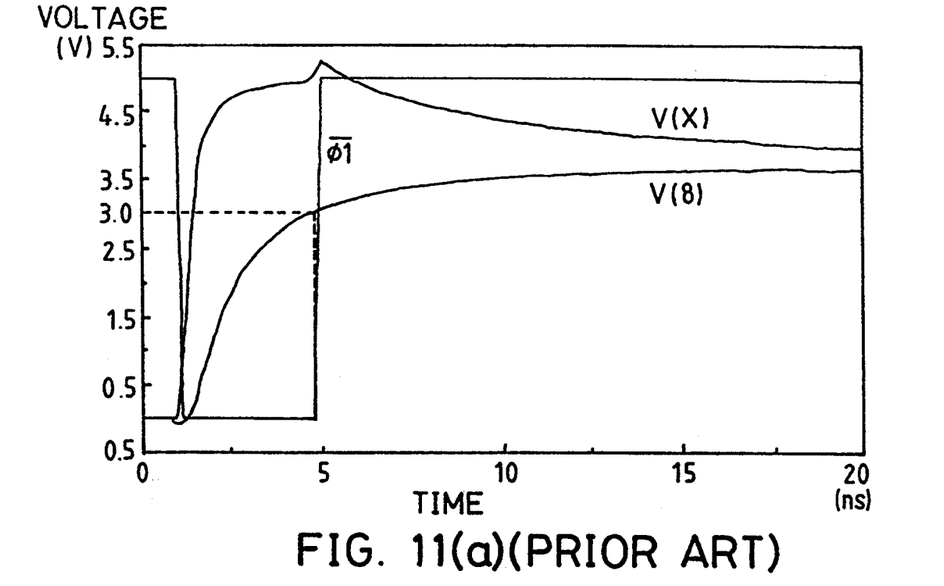
FIGS. 11(a) and 11(b) are two SPICE simulation results of the conventional circuit shown in FIG. 10(a) under the charge redistribution effect.
Figure 11B:
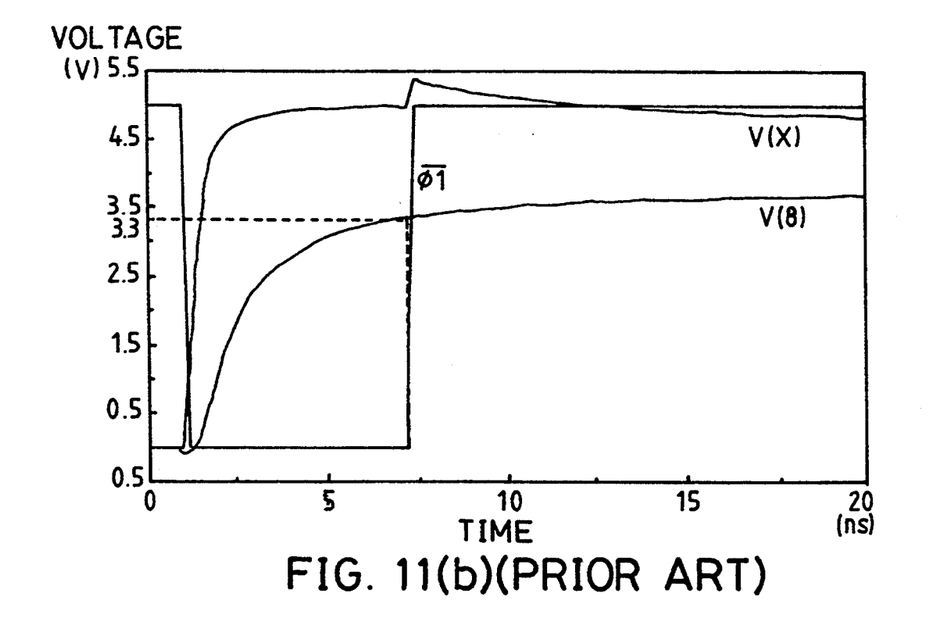

To compare the speed performance of the HS-PDCMOS logic structure with that of the conventional four-phase dynamic logic structure, the longest precharge and evaluation times in the conventional four-phase dynamic logic of FIG. 1 is determined. FIG. 10(a) illustrates the circuit condition which leads to the worst-case precharge time in the conventional four-phase logic. Since the input signals exist before the logic gate begins to precharge, the worst precharge case is that the lowest-positioned input signal in a string of stacked NMOS transistors is held low while other input signals are held high during the precharge phase. In this case, the PMOS transistor $P_p$ has to precharge the output node X and those internal nodes connected to the output node X. In the evaluation phase, the transistor $P_p$ is turned off while the transistor $N_h$ is turned on. Then, if the internal nodes are not precharged to their maximum extent, and the output node X is evaluated high, the charge redistribution occurs between the output node X and the internal nodes. It is found from simulation results that the node I in FIG. 10(a) should be at least recharged to 3.3 V at the end of the precharge phase in order not to cause a serious corruption of the output node voltage due to the charge redistribution effect. FIGS. 11(a) and 11(b) show the simulation results, in can be seen from FIG. 11(a) that the output voltage is precharged only to 3.0 V at the end of the precharge phase. In FIG. 11(b), the node 8 is precharged to 3.3 V at the end of the precharge phase. In this case, although the output voltage at the node X falls below 5 V in the evaluation phase due to the charge redistribution effect, it is still kept at a tolerable level.

Figure 10B:
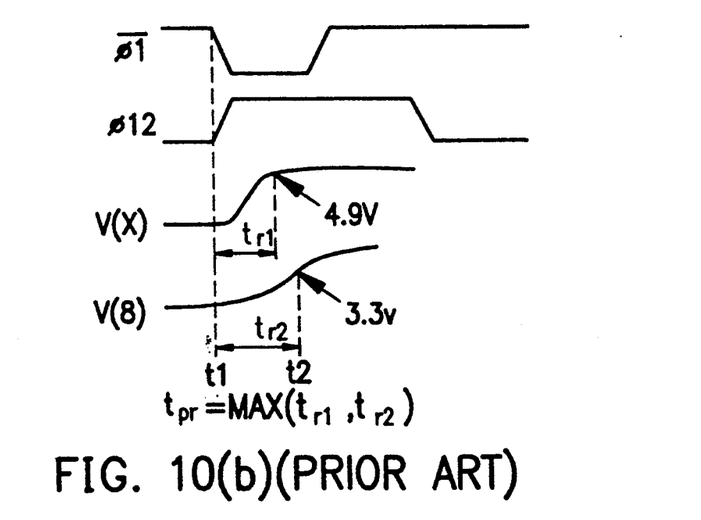
FIG. 10(b) is a schematical voltage variation diagram for several control clocks and nodes in the circuit of FIG. 10(a)

As shown in FIG. 10(b), the worst precharge time $t_{pr}$ is defined as the maximum value between the output rise delay time $t_{r1}$ and the rise delay time $t_{r2}$ at node 8. Since the dynamic circuits generally have a tighter requirement for noise immunity than the static circuits, the rise delay time $t_{r1}$ of the output node is defined as the difference between the time when the clock $\phi1$ begins to fall and the time when the output node reaches 4.9 V.

Figure 12A:
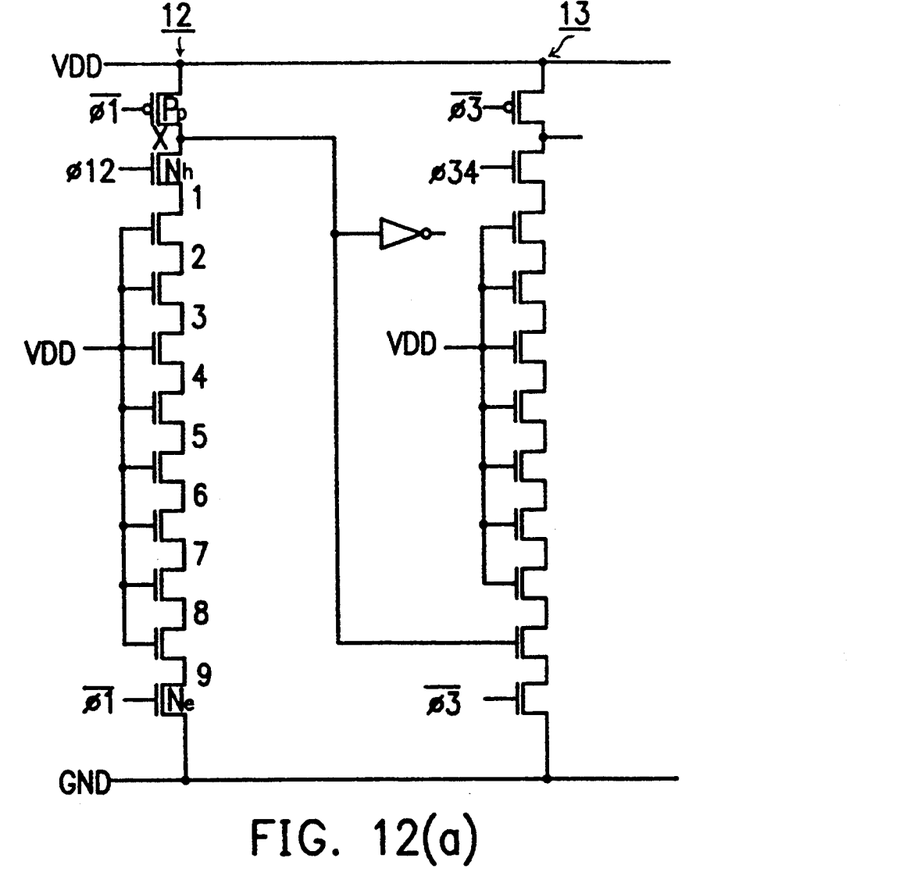
FIG. 12(a) is identical to FIG. 10(a), and the circuit is used to determined the worst evaluate time $t_{eva}$.
Figure 12B:
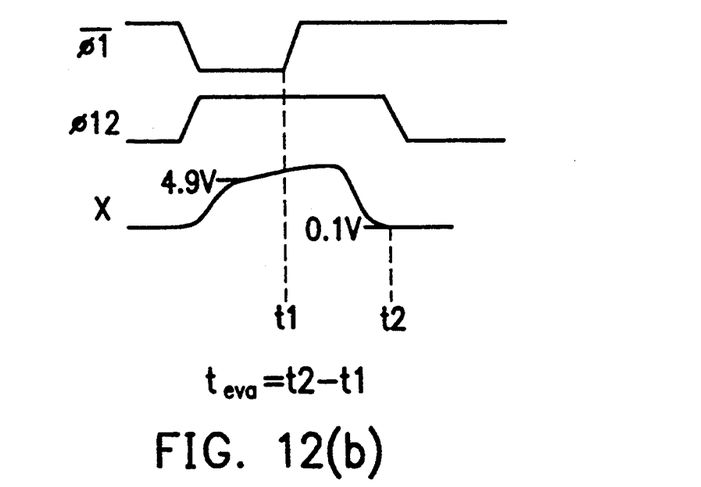
FIG. 12(b) is a schematical voltage variation diagram for two control clocks and a node in the circuit of FIG. 12(a)

The worst evaluation case occurs when the output node is evaluated low in the evaluation phase. As shown in FIG. 12(a), the charges accumulated at the internal nodes 2-9 during the precharge phase should be removed through the very long path to ground. In FIG. 11(b), the evaluation time $t_{eva}$ is defined as the time period from the time $t_1$ when the gate begins to evaluate, to the time $t_2$ when the voltage level of the output node X is pulled down to 0.1 V. Therefore, the maximum operation frequency of the conventional four-phase logic structure can be formulated as:

$$f_{max} = \frac{1}{2(t_{pr} + t_{eva})}$$

Based on the 1.2 μm CMOS process, the speed comparisons on multi-input NAND gates (FIG. 9(a)) between the first version of HS-PDCMOS logic structures of FIG. 5, the second version of HS-PDCMOS logic structure of FIG. 7, and the convention four-phase dynamic logic structure of FIG. 1 shown in Table III, in which the SPICE simulated $t_{ce}$, $t_{dis}$, $t_{pr}$, $t_{eva}$, and $f_{max}$ are listed. The simulated logic gate has a single fan-out load.

TABLE III

| Number of stacked NMOS's | First version of HS-PDCMOS | | | Second version of HS-PDCMOS | | | Conventional four-phase CMOS logic | | |
|---|---|---|---|---|---|---|---|---|---|
| | tce | tdis | fmax | tce | tdis | fmax | tpr | teva | fmax |
| 3 | 0.41 | 0.68 | 459 | 0.38 | 0.52 | 556 | 1.11 | 1.49 | 192 |
| 6 | 0.90 | 1.15 | 244 | 0.80 | 0.96 | 284 | 2.94 | 3.01 | 84.0 |
| 9 | 1.68 | 1.89 | 140 | 1.47 | 1.69 | 158 | 5.99 | 5.06 | 45.2 |
| 12 | 2.73 | 2.94 | 88.2 | 2.37 | 2.72 | 98.0 | 10.21 | 7.64 | 28.0 |
| 15 | 4.06 | 4.28 | 60.0 | 3.50 | 4.03 | 66.4 | 15.61 | 10.74 | 19.0 |

(tce tdis tpr teva:ns; fmax:MHZ)

It can be seen from Table III that the maximum operation frequency of the HS-PDCMOS logic circuit is about 2.5 to 3 times higher than that of the conventional four-phase dynamic logic circuit. Moreover, the more the logic complexity is, the more the speed benefit of the HS-PDCMOS logic is.

As described above, the HS-PDCMOS logic structure of the present invention has a special circuit structure, and can achieve a higher operation frequency than the convention four-phase logic. Of course, various circuit design techniques can also be applied to the original circuit structures shown in FIGS. 5 and 7 to further improve the speed performance and the circuit utilization. One of such techniques is described below.

Figure 13A:
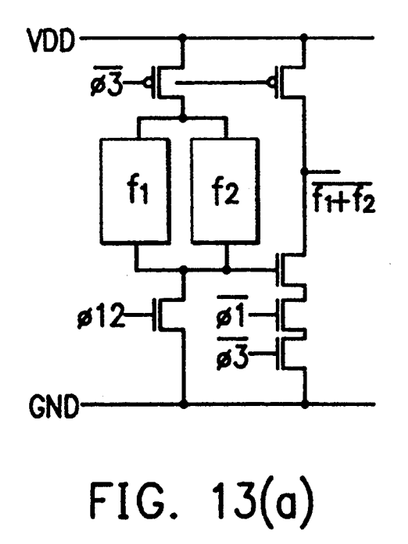
FIGS. 13(a) to 13(c) are schematically electrical diagrams of three application circuits according to the HS-PDCMOS logic structure of the present invention.
Figure 13B:
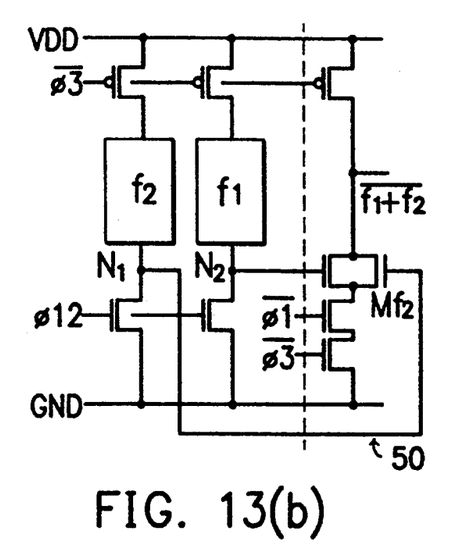
Figure 13C:
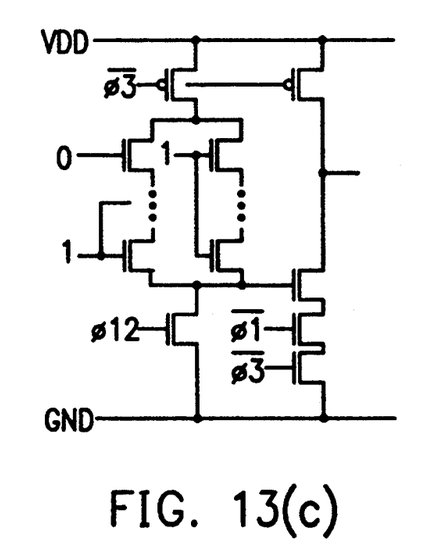

Referring to FIGS. 13(a) to 13(b), there are shown two different circuit designs for implementing the logic function $f_1+f_2$ according to the HS-PDCMOS logic structure. FIG. 13(a) shows the direct design of this logic function. That is to say, the function networks $f_1$ and $f_2$ are placed in parallel in the same gate to implement the OR function $f_1+f_2$. FIG. 13(b) shows another realization wherein the function networks are separated into two different function units, and the NOR function of $f_1$ and $f_2$ is implemented by the output NOR-type drive 50. FIG. 13(c) shows the same structure as FIG. 13(a), but further illustrating the logic tree structures of the function networks $f_1$ and $f_2$. Assume that the logic function $f_1$ has all input logic values of "1" while the logic function $f_2$ only has a single logic "0" input at the topt place with all other inputs in "1". In this case, the logic function at the node $N_a$ is:

$$f_{N4}=f_1+f_2=1+0=1$$

Thus, the node $N_A$ is precharged by the function network $f_1$ in the precharge phase of this logic gate. However, the internal node capacitance of the function network $f_2$ is also connected to the node $N_A$. This will increase the capacitive load at the node $N_A$, and decrease the precharge speed. The design of FIG. 13(b) can avoid this problem because the function networks $f_1$ and $f_2$ are placed in different function units of the HS-PDCMOS logic gate. Thus, it can be expected that the NOR-type HS-PDCMOS logic has a greater speed benefit than the direct design of FIG. 13(a).

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A CMOS dynamic logic structure comprising:
   a plurality of logic gates connected in sequence from first to last, each logic gate including
      a function unit having in series
         a first PMOS precharge transistor,
         a logic tree block; and
      a driver unit coupled to said function unit, and having in series
         first, second, and third NMOS evaluation transistors, and
         a second PMOS precharge transistor;
      the gate of said second NMOS evaluation transistor being coupled to said logic tree block of said function unit, and
      said third NMOS evaluation transistor and said second PMOS precharge transistor being controlled by a second identical clock in order not to be turned on simultaneously;
   wherein, for each of said logic gates after the first, the first NMOS evaluation transistor and first PMOS precharge transistor of the previous logic gate are controlled by a first identical clock in order not to be turned on simultaneously.

2. A CMOS dynamic logic structure as claimed in claim 1, wherein each logic gate has a charge/evaluate operation phase, an evaluation operation phase, and a discharge/hold operation phase.

* * * * *